United States Patent Office 3,694,383

Patented Sept. 26, 1972

3,694,383

PROCESS FOR THE PRODUCTION OF LIGHT-SENSITIVE POLYMER

Kyoichiro Azami, Ichikawa, Hiroshi Ohotani, Adachi-machi, and Hiroshi Fukutomi, Urawa, Japan, assignors to Dainippon Ink and Chemicals, Incorporated, Tokyo, Japan

No Drawing. Filed Dec. 14, 1970, Ser. No. 98,196
Int. Cl. C08g *33/00, 33/02*
U.S. Cl. 260—2 XA 13 Claims

ABSTRACT OF THE DISCLOSURE

A process for the production of a light-sensitive polymer which comprises substituting a light-sensitive group for the halogen atom of a polybishalomethyloxetane.

This invention relates to a process for producing new and valuable light-sensitive polymer, it being characterized in that a light-sensitive group is substituted for the halogen that is present in the polybishalomethyloxetane, a polymer having the recurring units of the following formula $$\left(-CH_2-\underset{CH_2X}{\overset{CH_2X}{C}}-CH_2-O-\right)$$

wherein X is halogen.

Now, this polybishalomethyloxetane has in itself very outstanding properties in that (1) it is chemically stable; (2) its hygroscopicity is very small, being on the order of below 0.01%; and (3) it is readily molded precisely. On the other hand, it has the drawback that (1) its crystallinity is high; and (2) it is not readily soluble in many of the organic solvents. As a consequence, it is being merely used as a molding material, and there thus has been no reports in literature as to its ever having been used as a light-sensitive polymer by being substituted by a light-sensitive group.

On the other hand, the polyvinyl cinnamic acid ester, for example, has been known to date as being a typical light-sensitive polymer in the art. However, this kind of polymer usually possesses various shortcomings when the rate of introduction of the light-sensitive group is low; namely, such as (1) its solubility in the general purpose solvents—especially, the solvents of the esters or ketones type—is limited; (2) its adhesiveness to metallic surface—especially, stainless steel—is weak; and (3) its resistance to attack by chemical—especially, resistance to acids—is inferior.

It is therefore an object of the present invention to improve on these shortcomings of the known techniques and to provide a process for the production of light-sensitive polymers which are suitably used for the various light-sensitive coating compositions such as plate making materials, light-curable coating materials and light-curable printing inks.

Other objects and advantages of the invention will be apparent from the following description.

The light-sensitive polymer obtained from polybishalomethyloxetane, we arrived at the conclusion that by using also retains intact the excellent properties of polybishalomethyloxetane, such as hereinbefore described. Moreover, since the halogen in the halomethyl group has been substituted by a light-sensitive group and its crystallinity has been lowered, it can be dissolved in many of the organic solvents, and when such a solution is applied to a metallic surface, the adhesiveness of the light-sensitive polymer to the metallic surface is great.

Having noted the foregoing properties of polybishalomethyloxetane, we arrived at the conclusion that by using this as the base polymer there was the possibility of its being highly suitable for the manufacture of an excellent light-sensitive polymer, such as hereinbefore described, and as result, of assiduous studies, we found, as expected, that the aforesaid objects of the invention could be achieved by the use of this polybishalomethyloxetane.

Thus a process for the production of a light-sensiitve polymer is provided in accordance with the present invention, wherein a reaction is carried out which comprises substituting a light-sensitive group for the halogen in a polybishalomethyloxetane containing the recurring units of the formula $$\left(-CH_2-\underset{CH_2X}{\overset{CH_2X}{C}}-CH_2-O-\right)$$

wherein X is halogen.

In this case, all of the halogens in the polybishalomethyloxetane may be substituted by the light-sensitive group, or this substitution may be in part, i.e,. preferably the substitution of at least 5% of the halogen by the light-sensitive group. Further, a single class of the compound containing the light-sensitive group may be used, or conjoint use may be made of two or more thereof. Again, a part of the halogen may be substituted by such as alkyl, cycloalkyl, aryl, aralkyl, nitro, cyano, alkoxy, aryloxy, aralkyloxy, hydroxyl amino and acylamino groups, or $$-\overset{O}{\overset{\|}{C}}-R$$

wherein R in either case is alkyl. Since the affinity for printing ink of the foregoing compound can be enhanced by a suitable choice of these groups, the invention light-sensitive polymer is especially valuable when it is used as plate making materials.

The term "light-sensitive group," as used herein, is meant to be a group which can form a reticular structure by the setting up of a chemical reaction by irradiation with actinic rays. For example, mention can be made of the cinnamic acid ester group

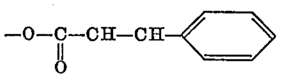

N,N-disubstituted dithiocarbamic acid ester group $$-S-\underset{\underset{S}{\|}}{C}-N\begin{matrix}R\\R'\end{matrix}$$

azido group $-N_3$, azidobenzoic acid ester group

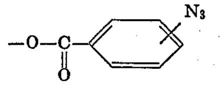

azidocinnamic acid ester group

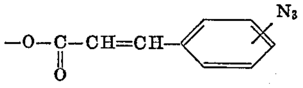

azidobenzenesulfonic acid ester group

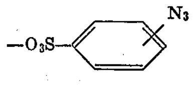

furan acrylic acid ester group

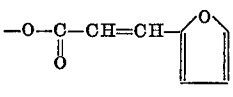

and the derivatives thereof. Compounds containing such light sensitive groups as mentioned are used in the hereinbefore described substitution reaction. As examples of such compounds, included are such as alkali metals preferably sodium or potassium salts of cinnamic acid, alkali metals of N,N-disubstituted dithiocarbamic acid, alkali metal azides, alkali metal salts of azidobenzoic acid, alkali metal salts of azidocinnamic acid, alkali metal salts of azidobenzenesulfonic acid and alkali metal salts of furan acrylic acid.

In accomplishing the substitution of the halogen in the polybishalomethyloxetane by the foregoing light-sensitive group, the use of an organic solvent which can at least dissolve the polybishalomethyloxetane is preferred. Such an organic solvent can be chosen from a broad range of solvents, included being such, for example, as dimethylformamide, dimethyl sulfoxide, dioxane, tetrahydrofuran, cyclohexane, o-dichlorobenzene and N-methylpyrrolidone.

While the reaction for introducing the aforesaid light-sensitive group into the polybishalomethyloxetane by substitution of it for the halogen contained in the polybishalomethyloxetane can, as previously noted, be readily carried out by heating the polybishalomethyloxetane with the light-sensitive group-containing compound with stirring, the reaction conditions such as hereinbelow indicated can be used.

The molar ratio of the acid salt relative to one unit of the repeating units, the principal constituent unit of said polybishalomethyloxetane, having the formula $$\left( -CH_2-\underset{CH_2X}{\overset{CH_2X}{\underset{|}{\overset{|}{C}}}}-CH_2-O- \right)$$

wherein X is halogen, is roughly 0.5 to 3.0, and preferably 0.75 to 1.0. The reaction temperature to be used is suitably 30°–160° C., and preferably 60° to 150° C. On the other hand, the reaction time is from 1 to 30 hours, and preferably 6 to 25 hours.

The foregoing organic solvent is preferably used in an amount of 20 to 100 parts by volume relative to one part by volume of the polybishalomethyloxetane.

While the optimum amount of the light-sensitive group to be introduced in the case of the light-sensitive resin according to the invention process will vary somewhat depending upon the class of the light-sensitive group chosen, the amount suitable in the case of, say, the cinnamic acid and azide types is 10–70% and in the case the carbamate type is 10 to 40%.

For separating the so obtained light-sensitive polymer from the reaction solvent, this may be accomplished by precipitating the light-sensitive polymer, using a solvent which is compatible with the reaction solvent but does not dissolve the light-sensitive polymer. As such a solvent, mention can be made of water and the alcohols such, for example, as methanol, ethanol, propanol and butanol. After separating the polymer in this manner, it is then washed and vacuum dried in customary manner, whereupon the invention light-sensitive polymer is usually obtained as a fine powder.

For preparing such light-sensitive coating compositions as plate making material, light-curable coating material, light-curable printing ink, etc., from the so obtained light-sensitive polymer, the conjoint use of an organic solvent which can dissolve said light-sensitive polymer and a light sensitizer is preferred. The preferred amount to be used of the light-sensitive polymer is from 0.5 to 20% by weight based on the total weight of light-sensitive polymer, organic solvent and light sensitizer.

The foregoing organic solvent which can be used conjointly with the light-sensitive polymer include, for example, ketones such as acetone, methyl ethyl ketone and cyclohexanone; amides such as N,N-dimethylformamide; ethers such as dioxane, tetrahydrofuran, Cellosolve acetate and diethyl carbitol; aromatic hydrocarbons such as toluene and xylene; and also dimethyl sulfoxide and N-methylpyrrolidone. These organic solvents can be used either singly or in combination of two or more.

On the other hand, the foregoing light sensitizer is a compound which upon exposure to light functions catalytically in connection with the cross-linking reaction. Effective are, for example, p-nitroaniline, 2,4-dinitroaniline, Michler's ketone, 3-methyl - 1,3 - diazo-1,9-benzanthrone, 5-nitroacenaphthene, picric acid, 2,4,6-trinitrobenzoic acid, 2,5-diphenyl-p-quinone, 1,2-benzanthraquinone, 4,4' - tetraethyldiaminodiphenyl ketone, 4,4' - tetramethyldiaminobenzophenoneimide, 1 - methyl-2-benzoylmethylene-betanaphthothiazoline, 4,4' - diazidostilbene-2,2'-disulfonic acid and benzoin methyl ether.

When a light-sensitive coating composition such as hereinabove described is applied to a suitable support, e.g., a metallic plate, and the organic solvent is evaporated by air-drying, heating, etc., a so-called presensitized light-sensitive coating is obtained. When this light-sensitive coating is exposed to actinic rays through either a negative film or a pattern, reaction of the light-sensitive groups takes place in the exposed areas to form a reticular structure, which becomes insoluble in solvents and has a strong resistance to acids, alkalis, solvents and the like. On the other hand, the unexposed areas can be removed from the surface of the support by means of a solvent which can dissolve this unexposed coating or an emulsion containing such a solvent. Thus, a distinct image which is in accordance with the negative film or pattern is developed. After the development, the support can, of course, be re-exposed to actinic rays to accelerate the formation of the reticular structure.

The following examples are given to further illustrate the present invention.

EXAMPLE 1

A 3-necked, 100-ml. flask equipped with an agitator, a thermometer and a reflux condenser was charged with a solution of 3.1 grams of polybischloromethyloxetane in 70 ml. of N,N-dimethylformamide, after which 7.0 grams of potassium cinnamate was added and the reaction solution was heated under reflux for 15 hours. After completion of the reaction, the reaction mixture was slowly poured into a large quantity of water which was being stirred with a homomixer to precipitate the resulting light-sensitive polymer into the water. The precipitate was separated by means of a centrifuge, washed two or three times in methanol, and dried for 24 hours at room temperature and reduced pressure obtained by means of a vacuum pump, whereupon was obtained a powdery light-sensitive polymer in an amount of 3.5 grams.

When the light-sensitive polymer was analyzed for its chlorine content, it was found that 25.4% of the chlorine atoms contained in the polybischloromethyloxetane was substituted.

Further, when an infrared absorption spectrum analysis was carried out on the light-sensitive polymer, as characteristic absorptions of the cinnamic acid ester group, there was an absorption due to $>C=O$ at 1720 cm.$^{-1}$ and an absorption due to $>C=C<$ at 1640 cm.$^{-1}$. And at 1580 cm.$^{-1}$ there was an absorption due to the benzene nucleus. Thus, it was confirmed that the cinnamic ester group had been introduced into the light-sensitive polymer.

One gram of the so obtained light-sensitive polymer was dissolved along with 0.1 gram of 5-nitroacenaphthene in 100 ml. of methyl ethyl ketone, after which the resulting solution was charged to a 200-ml. flash and stirred at room temperature to prepare a light-sensitive coating composition. Next, this light-sensitive coating composition was applied by means of the dipping technique to the surface of a ball grained aluminum plate, after which the solvent was removed with a drier to form a light-sensitive coating. The Photographic Step Tablet 21 steps, a product of Eastman Kodak Company, was placed in contact atop this light-sensitive coating and an exposure was made with ultraviolet rays under the conditions of an intensity of 62,000 w./cm.$^2$ and 2 time of 30 seconds, using a 250-w. high pressure mercury vapor lamp. This was followed by development of the unexposed areas and dyeing of exposed areas to cause the image to stand out. As a result, it was found that the light-sensitive coating had an excellent sensitivity.

EXAMPLE 2

A 3-necked, 100-ml. flask equipped with a thermometer, an agitator and a reflux condenser was charged with a solution of 3.1 grams of polybischloromethyloxetane in 70 ml. of dimethylformamide and, after adding 2.6 grams sodium azide, the reaction mixture was heated under reflux for 6 hours. After completion of the reaction, the reaction mixture was poured into methanol to precipitate a light-sensitive polymer, which was separated by filtration to isolate a light-sensitive polymer having a rubbery elasticity.

When this light-sensitive polymer was analyzed for its chlorine content, it was found that 59.5% of the chlorine atoms contained in the polybischloromethyloxetane had been substituted.

Further, when this light-sensitive polymer was analyzed as to infrared absorption spectrum, there was as a characteristic absorption of the azido group a pronounced absorption at 2120 cm.$^{-1}$ and absorptions due to —C—N at 1450 cm.$^{-1}$ and 1295 cm.$^{-1}$. Thus it was shown that the azido group had been introduced into the light sensitive polymer.

Next, 3 grams of this light-sensitive polymer were dissolved along with 0.3 gram of 5-nitroacenaphthene in 100 ml. of toluene, after which the resulting solution was charged to a 150-ml. flash and stirred at room temperature to prepare a light-sensitive coating composition. The so obtained light-sensitive coating composition was then applied to a ball grained zinc plate to form a light-sensitive film thereon. This was followed by placing a gray scale atop the film in contact therewith and giving the film an exposure of ultraviolet rays under the conditions of an intensity of 62,220 $\mu$w./cm.$^2$ and a time of 35 seconds. After completion of the exposure, development was carried out with a toluene-methyl ethyl ketone solvent mixture, whereupon the unexposed areas of the coating were removed. It was found that the light-sensitive coating had an excellent sensitivity.

EXAMPLE 3

A 3-necked, 100-ml. flask equipped with a thermometer, an agitator and a condenser was charged with a solution of 3.2 grams of polybischloromethyloxetane in 70 ml. of dimethyl sulfoxide, followed by the addition of 6.6 grams of sodium diethyldithiocarbamate, after which the mixture was heated under reflux for 6 hours. After completion of the reaction, the reaction mixture was poured into a large quantity of methanol to precipitate a light-sensitive polymer. The resulting precipitate was separated by centrifuging and dried for 24 hours under reduced pressure obtained by means of a vacuum pump, thereby isolating 3.6 grams of the light-sensitive polymer.

As a result of a chlorine analysis, it was found that 13.0% of the chlorine atoms contained in the polybischloromethyloxetane had been substituted.

As a result of an analysis by means of the infrared absorption spectrum, it was shown that the diethyldithiocarbamic acid ester group had been introduced into the light-sensitive polymer.

Next, a light-sensitive coating composition was prepared by dissolving 2 grams of this light-sensitive polymer in 100 ml. of dioxane and adding thereto 0.2 gram of benzoin methyl ether as the light sensitizer. The so obtained coating composition was applied to the copper surface of a printed circuit board to form a light-sensitive coating thereon, after which a negative film having a printed circuit pattern was laid thereon in contact with the light-sensitive coating. The light-sensitive coating was then exposed to ultraviolet rays under the conditions of an intensity of 60,000 $\mu$w./cm.$^2$ and a time of 35 seconds to cure the exposed areas of the coating, following which the unexposed areas was dissolved and removed with dioxane to complete the development. Next, when the surface of the copper plate was corroded with a ferric chloride solution, a printed circuit board true to the printed circuit pattern was obtained, and it was found that the cured coating on the copper surface fully possessed the function of a non-corrosive.

EXAMPLE 4

A 3-necked, 100-ml. flask equipped with an agitator, a stirrer and a condenser was charged with a solution of 3.1 grams of polybischloromethyloxetane in 70 ml. of dioxane, followed by the addition of 5.3 grams of potassium phenoxide, after which the mixture was heated under reflux for 24 hours. After completion of the reaction, the reaction mixture was poured into a large quantity of water to precipitate a phenoxychloromethyloxetane polymer, followed by separation of the precipitate by filtration, washing of the polymer two or three times in methanol and thereafter drying the polymer at room temperature for 24 hours under reduced pressure obtained by means of a vacuum pump to isolate the phenoxychloromethyloxetane polymer.

When this phenoxychloromethyloxetane polymer was analyzed for its chlorine content, it was found that 31.3% of the chlorine atoms had been substituted.

Further, as a result of an infrared absorption spectrum analysis of this polymer, characteristic absorptions of the benzene nucleus were noted at 1600 cm.$^{-1}$ and 1500 cm.$^{-1}$, showing that the phenoxy group had been introduced.

Next, a solution of 2.4 grams of this phenoxychloromethyloxetane polymer in 60 ml. of dimethylformamide was charged to the hereinabove described 3-necked flask and, after addition of 2.3 grams of potassium cinnamate, heated under reflux for 12 hours. After completion of the reaction, the reaction mixture was poured into a large quantity of water to precipitate a light-sensitive polymer. The precipitate was then separated by filtration, washed for two or three times with methanol, and thereafter dried for 24 hours under reduced pressure obtained by means of a vacuum pump to isolate the light-sensitive polymer.

When this light-sensitive polymer was analyzed for its chlorine content it was found that 11.0% of the chlorine atoms contained in the phenoxychloromethyloxetane polymer had been substituted by the cinnamic acid ester groups.

On the other hand, when an infrared absorption spectrum analysis was carried out on this light-sensitive polymer, there was an absorption of $>C=O$ at 1720 cm.$^{-1}$, an absorption due to $>C=C<$ at 1640 cm.$^{-1}$, and also an absorption due to the skeletal vibration of the benzene nucleus at 1580 cm.$^{-1}$, thus showing that the cinnamic acid ester group had been introduced into this light-sensitive polymer.

One gram of the so obtained light-sensitive polymer was dissolved in 50 ml. of tetrahydrofuran followed by the addition 1.0 gram of 1-methyl-2-benzoyl-beta-naphthothiazoline to prepare a light-sensitive coating composition. Next, this light-sensitive coating composition was applied to a ball grained aluminum plate to form a light-sensitive coating thereon, after which a negative film for lithographic use was placed over in contact with the aforesaid coating. This was then exposed to ultraviolet rays under the conditions of an intensity of 58,000 $\mu$w./cm.$^2$ and a time of 20 seconds, followed by curing the exposed areas of the coating and dissolution and removal of the unexposed areas of the coating with tetrahydrofuran to complete the development process. After drying the cured coating on the aluminum plate, it was again exposed to ultraviolet rays under the conditions of an intensity of 58,000 μw./cm.$^2$ and a time of 50 seconds. The so prepared printing plate for lithographic use was satisfactory in its resistance to attrition resulting from the printing operation.

EXAMPLE 5

A 3-necked, 100-ml. flask equipped with an agitator, a thermometer and a reflux condenser was charged with a solution in 50 ml. of dimethylformamide of 2.5 grams of the phenoxychloromethyloxetane polymer obtained in Example 4, following which the mixture was heated under reflux for 9 hours after addition of 1.7 grams of sodium azide. After completion of the reaction, the reaction mixture was poured into a large quantity of water, and the light-sensitive polymer formed was precipitated, following which the precipitate was separated by filtration and thereafter dried under reduced pressure obtained by means of a vacuum pump to isolate an amorphous light-sensitive polymer.

When an infrared absorption spectrum analysis of this light-sensitive polymer was carried out, there was an absorption due to the azide group at 2100 m.$^{-1}$ and absorptions due to —C—N at 1300 cm.$^{-1}$ and 1450 cm.$^{-1}$, thus showing that the azido group had been introduced into the light-sensitive polymer.

On the other hand, it was found by an analysis of the chlorine content that 94.8% of the chlorine atoms remaining in the phenoxychloromethyloxetane polymer had been substituted by the azide group.

Next, 2 grams of this light-sensitive polymer were dissolved in 100 ml. of Cellosolve acetate followed by the addition of 0.2 gram of 2,4,6-trinitrobenzoic acid as the light sensitizer to prepare a light-sensitive coating composition. The so prepared light-sensitive coating composition was then applied to a ball grained aluminum plate to form a light-sensitive coating thereon. A gray scale was then placed atop the coating in contact therewith, and the coating was exposed to ultraviolet rays under the conditions of an intensity of 58,400 μw./cm.$^2$ and a time of 20 seconds. This was followed by development of the exposed areas with ethyl Cellosolve acetate, whereupon this light-sensitive coating exhibited a satisfactory sensitivity.

Further, when a printing plate for lithographic use was prepared using this light-sensitive polymer and used for effect printing, good printed matter was obtained.

EXAMPLE 6

A 3-necked, 100-ml. flask equipped with an agitator, a thermometer and a reflux condenser was charged with a solution in 70 ml. of dimethylformamide of 2.4 grams of the phenoxychloromethyloxetane polymer obtained in Example 4 and, after adding 3.8 grams of sodium diethyldithiocarbamate, the mixture was reacted for 10 hours at 60° C. After completion of the reaction, the reaction mixture was poured into a large quantity of methanol, and the light-sensitive polymer formed was precipitated, followed by separation of the precipitate, and thereafter drying it under reduced pressure obtained by means of a vacuum pump to isolate 2.6 grams of an amorphous light-sensitive polymer.

When this light-sensitive polymer was analyzed for its chlorine content, it was found that 15% of the chlorine atoms contained in the phenoxychloromethyloxetane had been substituted.

Next, 2 grams of the here obtained light-sensitive polymer were dissolved in 80 ml. of a 1:1 mixture of methyl ethyl ketone and acetone followed by the addition of 0.2 gram of Michler's ketone to prepare a light-sensitive coating composition. The so obtained coating composition was applied to a ball grained zinc plate to form a light-sensitive coating thereon, after which a negative film for lithographic printing plate use was placed atop the coating in contact therewith and the coating was exposed to ultraviolet rays under the conditions of an intensity of 62,000 μw./cm.$^2$ and a time of 30 seconds. The unexposed areas was then developed with a 1:1 mixture of methyl ethyl ketone and acetone, and the cured coating obtained on the zinc plate was dried, after which the naked metallic part was moistened with water and applied a protection ink, whereupon was obtained a clear image true to the negative film.

EXAMPLE 7

A 3-necked, 300-ml. flask equipped with a thermometer, an agitator and a reflux condenser was charged with a solution of 9.3 grams of polybischloromethyloxetane in 200 ml. of dimethylformamide and, after addition thereto of 11.8 grams potassium acetate, the mixture was heated under reflux for 9 hours. After completion of the reaction, the reaction mixture was poured into a great quantity of water to precipitate the resulting acetylated chloromethoxetane polymer, after which the resulting precipitate was separated by means of a centrifuge and thereafter dried under reduced pressure obtained from a vacum pump to isolate 5.7 grams of an acylated chloromethyloxetane polymer.

When the here obtained acylated chloromethyloxetane polymer was analyzed for its chlorine content, it was found that 48.2% of the chlorine atoms contained therein had been substituted by the acetyl group.

Next, a solution in 180 ml. of a dioxane-methanol (volume ratio=50:50) solvent mixture of 5.7 grams of the foregoing acetylated chloromethyloxetane polymer was charged to the hereinbefore described 3-necked flask and, after adding a methanol solution of 6 N sulfuric acid, was saponified by heating under reflux for 5 hours. After completion of the reaction, the reaction mixture was poured into a great quantity of water to precipitate a hydroxylated chloromethyloxetane polymer, which was then dried under reduced pressure obtained by means of a vacuum pump to isolate the hydroxylated chloromethyloxetane polymer methyloxetane polymer (rate of saponification of above 98%).

This was followed by the preparation of a solution consisting of 2.0 grams of the so obtained hydroxylated chloromethyloxetane polymer in solution in a solvent mixture of 50 ml. of methyl ethyl ketone and 8 ml. pyridine, to which was slowly added dropwise a solution of 4 grams of cinnamoyl chloride in 10 ml. of methyl ethyl ketone, while cooling the reactor, followed by raising the temperature and heating under reflux for 3 hours. After completion of the reaction, the reaction mixture was poured into a large quantity of water to precipitate a light-sensitive polymer, followed by separation of the precipitate by filtration and thereafter washing the separated precipitate in methanol and drying under reduced pressure obtained by means of a vacuum pump to isolate the light-sensitive polymer.

The so obtained light-sensitive polymer was one in which 98% of the hydroxyl groups contained in the hydroxylated chloromethyloxetane polymer had been esterified by means of cinnamoyl chloride.

A light-sensitive coating composition was then prepared by dissolving 2 grams of the so obtained light-sensitive polymer in 100 ml. of cyclohexane and by the addition of 0.2 gram of 5-nitroacenaphthene thereto. This light-sensitive coating composition was applied to a ball grained aluminum plate to form a light-sensitive coating thereon. This was followed by placing a negative film for lithographic plate use in contact with the coating and exposure to ultraviolet rays under the conditions of an intensity of 63,000 μw./cm.$^2$ and a time of 25 seconds, after which the exposed coating was developed with a developer consisting of cyclohexanone dispersed in water to prepare a printing plate for lithographic use. When offset printing was carried out using this printing plate, satisfactory printings were obtainable.

EXAMPLE 8

Five ml. of pyridine were added to a solution obtained by dissolving 2 grams of the hydroxylated chloromethyloxetane polymer obtained in Example 7, in 30 ml. of tetrahydrofuran. To the so obtained solution was slowly added dropwise a solution of 4 grams of 3-azidobenzoic acid chloride in 10 ml. of tetrahydrofuran. After completion of the dropping, the temperature of the reaction mixture was raised to 80° C. and the reaction was carried out for 3 hours. After completion of the reaction, the reaction mixture was poured into a great quantity of methanol to precipitate a light-sensitive polymer, followed by separation of the precipitate by filtration and thereafter drying under reduced pressure obtained by means of a vacuum pump to isolate the light-sensitive polymer.

The so obtained light-sensitive polymer was one in which 98% of the hydroxyl groups contained in the hydroxylated chloromethyloxetane polymer had been esterified by means of 3-azidobenzoic acid chloride.

As light-sensitive coating composition was prepared by dissolving in 100 ml. of toluene 2 grams of the foregoing light-sensitive polymer and as a light-sensitizer 0.2 gram of 1,2-benzanthraquinone. The following test was carried out to determine the resistance to chemicals, and specifically resistance to a ferric chloride solution, of this light-sensitive coating composition. A copper plate was applied to this light-sensitive coating composition to form a light-sensitive coating thereon. A negative film was placed on the light-sensitive coating in contact therewith and the coating was exposed to ultraviolet rays under the conditions of an intensity of 63,600 $\mu$w./cm.$^2$ and a time of 45 seconds, followed by development of the exposed coating. When the metallic surface having the exposed coating was then caused to be acted upon by means of a ferric chloride solution, the light-cured coating demonstrated a very excellent chemical resistance.

EXAMPLE 9

A 3-necked, 100-ml. flask equipped with an agitator, a thermometer and a reflux condenser was charged with a solution of 4.9 grams of polybisbromomethyloxetane in 80 ml. of N,N-dimethylsulfoxide, followed by the addition of 14 grams of potassium cinnamate, after which the reaction mixture was heated under reflux for 10 hours. After completion of the reaction, the reaction mixture was poured into a great quantity of water to precipitate the resulting light-sensitive polymer, after which the precipitate was separated by filtration, washed two or three times in methanol and thereafter dried under reduced pressure obtained by means of a vacuum pump to isolate the light-sensitive polymer.

When the so obtained light-sensitive polymer was analyzed for its bromine content, it was found that 35% of the bromine atoms contained in the polybisbromomethyloxetane had been substituted by the cinnamic acid ester groups.

Next, a light-sensitive coating composition was prepared by dissolving 2 grams of the light-sensitive polymer in 100 ml. of ethyl Cellosolve acetate and the addition thereto of 0.2 gram of 4,4-diazidestilbene-2,2'-sulfonic acid as a light sensitizer. The so obtained light-sensitive coating composition was then applied to a ball grained aluminum plate to form a light-sensitive coating thereon, following which a negative film for lithographic plate use was placed on the coating in contact therewith and the coating was exposed to ultraviolet rays under the conditions of an intensity of 68,000 $\mu$w./cm.$^2$ and a time of 30 seconds. The coating was then developed with ethyl Cellosolve acetate to prepare a lithographic plate. When offset printing was carried out using this lithographic plate, satisfactory printing matter was obtainable.

The light-sensitive polymer prepared in accordance with the present invention has the following advantages, it excels in chemical stability, it is soluble in a great number of organic solvents, and its adhesiveness to objects such as of metals is great when applied in the form of a solution. Hence, it can be used for plate making materials, light-cured coating materials and light-cured printing ink.

We claim:

1. A process for the production of a light-sensitive polymer which comprises substituting a light-sensitive group selected from a cinnamic acid ester group, N,N-disubstituted dithiocarbamic acid ester group, azide group, azidobenzoic acid ester group, azidocinnamic acid ester group, azidobenzenesulfonic acid ester group and furan acrylic acid ester group for the halogen atom of a polybishalomethyloxetane by reacting said polybishalomethyloxetane with a compound selected from alkali metal salts of cinnamic acid, alkali metal salts of N,N-disubstituted dithiocarbamic acid, alkali metal azides, alkali metal salts of azidobenzoic acid, alkali metal salts of azidocinnamic acid, alkali metal salts of azidobenzenesulfonic acid and alkali metal salts of furan acrylic acid.

2. The process of claim 1 wherein at least 5% of the halogen atoms of said polybishalomethyloxetane is replaced by said light-sensitive group.

3. The process of claim 2 wherein all of the halogen atoms of said polybishalomethyloxetane are replaced by said light-sensitive group.

4. The process of claim 1 wherein said polybishalomethyloxetane is polybischloromethyloxetane.

5. The process of claim 1 wherein said polybishalomethyloxetane is polybisbromomethyloxetane.

6. The process of claim 1 wherein said polybishalomethyloxetane is polybisisodomethyloxetane.

7. The process of claim 1 wherein said light-sensitive group is a cinnamic acid ester group.

8. The process of claim 1 wherein said light-sensitive group is N,N-disubstituted dithiocarbamic acid ester group.

9. The process of claim 1 wherein said light-sensitive group is an azide group.

10. The process of claim 1 wherein said light-sensitive group is an azidobenzoic acid ester group.

11. The process of claim 1 wherein said light-sensitive group is an azidocinnamic acid ester group.

12. The process of claim 1 wherein said light-sensitive group is an azidobenzenesulfonic acid ester group.

13. The process of claim 1 wherein said light-sensitive group is a furan acrylic acid ester group.

References Cited

UNITED STATES PATENTS

| | | | |
|---|---|---|---|
| 3,594,348 | 7/1971 | Maar et al. | 260—2 XA |
| 3,499,759 | 3/1970 | Maar et al. | 260—2 XA |
| 3,066,117 | 11/1962 | Thoma et al. | 260—75 TN |

SAMUEL H. BLECH, Primary Examiner

U.S. Cl. X.R.

96—91 N, 115 R; 117—93.31, 132 R, 161 R, 161 UA; 174—68.5; 204—159.14; 260—30.2, 30.4 R, 30.8 DS, 31.6, 32.6 R, 32.8 R, 33.2 R, 33.6 R, 79, 79.3 R